United States Patent [19]

Ikeda et al.

[11] Patent Number: 5,005,068
[45] Date of Patent: Apr. 2, 1991

[54] SEMICONDUCTOR MEMORY DEVICE

[75] Inventors: Shuji Ikeda, Koganei; Katsuro Sasaki, Fuchuu; Kouichi Nagasawa, Kunitachi; Satoshi Meguro, Nishitama, all of Japan

[73] Assignee: Hitachi, Ltd., Tokyo, Japan

[21] Appl. No.: 376,953

[22] Filed: Jul. 7, 1989

Related U.S. Application Data

[63] Continuation of Ser. No. 5,950, Jan. 22, 1987, abandoned.

[30] Foreign Application Priority Data

Jan. 22, 1986 [JP] Japan .................................. 61-10077

[51] Int. Cl.⁵ .................... H01L 29/040; H01L 27/020
[52] U.S. Cl. ......................................... 357/59; 357/42; 357/51
[58] Field of Search ................. 357/51, 42, 59, 54, 357/23.3, 23.9

[56] References Cited

U.S. PATENT DOCUMENTS

| | | | |
|---|---|---|---|
| 4,209,716 | 6/1980 | Raymond, Jr. | 537/59 |
| 4,291,328 | 9/1981 | Lien et al. | 357/59 |
| 4,453,175 | 6/1984 | Ariizumi et al. | 357/154 |
| 4,488,166 | 12/1984 | Lehrer | 357/59 |
| 4,604,641 | 8/1986 | Konishi | 357/59 |
| 4,710,892 | 12/1987 | Masuoka et al. | 365/154 |
| 4,774,203 | 9/1988 | Ikeda et al. | 357/59 |

FOREIGN PATENT DOCUMENTS 0087979 9/1983 European Pat. Off. .

OTHER PUBLICATIONS

Ochii, et al., "A 17ns 64K CMOS RAM with a Schmitt Trigger Sense Amplifier", ISSCC Digest of Technical Papers, pp. 64–65; Feb. 13, 1985.

*Primary Examiner*—Rolf Hille
*Assistant Examiner*—Peter Toby Brown
*Attorney, Agent, or Firm*—Antonelli, Terry, Stout & Kraus

[57] ABSTRACT

A static RAM having first word lines each defined by extended gate electrodes of MISFETs constituting memory cells, and second word lines which are separate from the first word lines. The RAM has a wiring for supplying a fixed potential such as a ground potential to the memory cells, the wiring being formed from the same layer as that for forming the second word lines.

45 Claims, 10 Drawing Sheets

SEMICONDUCTOR MEMORY DEVICE

This application is a continuation of application Ser. No. 005,950, filed Jan. 22, 1987, now abandoned.

BACKGROUND OF THE INVENTION

The present invention relates to a semiconductor memory device. More particularly, the present invention relates to a technique which may effectively be used for a semiconductor integrated circuit device having a static random-access memory (hereinafter referred to as "SRAM").

Each of the memory cells of a typical conventional SRAM is, for example, composed of a flip-flop circuit comprising two high resistance load elements and two driving MISFETs (Metal Insulator Semiconductor Field Effect Transistors), and two transfer MISFETs which are respectively connected to a pair of input/output terminals of the flip-flop circuit. The high-resistance load elements are constituted by a polycrystalline silicon film which is formed integrally with a power source voltage wiring for the purpose of reducing the memory cell area and thereby achieving a larger interaction. SRAM is disclosed in, for example, U.S. Pat. No. 4,554,279 (Japanese Patent Laid-Open No. 130461/1982) issued on Nov. 26, 1985.

SUMMARY OF THE INVENTION

We have examined conventional SRAMs, typically represented by the high-resistance load type SRAM, in terms of improvement in reliability and achievement of high speed and large integration. To increase the operation speed, word lines are preferably formed using a wiring material having a smaller resistance, e.g., an aluminum layer. To increase the write/read margin for memory cells and thereby to prevent inversion of data caused by α-rays or the like (soft error), a wiring for supplying a ground potential to the memory cells is preferably formed using a wiring material having a small resistance, e.g., an aluminum layer. Further, it is preferable to satisfy these requirements simultaneously while avoiding an increase in the number of wirings, a reduction in the scale of integration and complication of the manufacturing process.

It is an object of the present invention to increase the operation speed of a semiconductor memory device such as an SRAM.

It is another object of the present invention to improve the reliability of a semiconductor memory device such as an SRAM.

It is still another object of the present invention to provide a technique which enables the above-described objects to be attained without any reduction in the scale of integration.

It is a further object of the present invention to lower the power dissipation or consumption of a semiconductor memory device.

The above and other objects, novel features and advantages of the present invention will become more apparent from the following description taken in conjunction with the accompanying drawings.

A representative one of the novel techniques disclosed in this application will briefly be described below.

There are provided first word lines each defined by extended gate electrodes of MISFETs constituting memory cells, and second word lines which are separate from the first word lines. In addition, a wiring for supplying a fixed potential such as a ground potential to the memory cells is formed from the same layer as that for forming the second word lines.

DESCRIPTION OF THE PREFERRED EMBODIMENTS

Figure 1A:
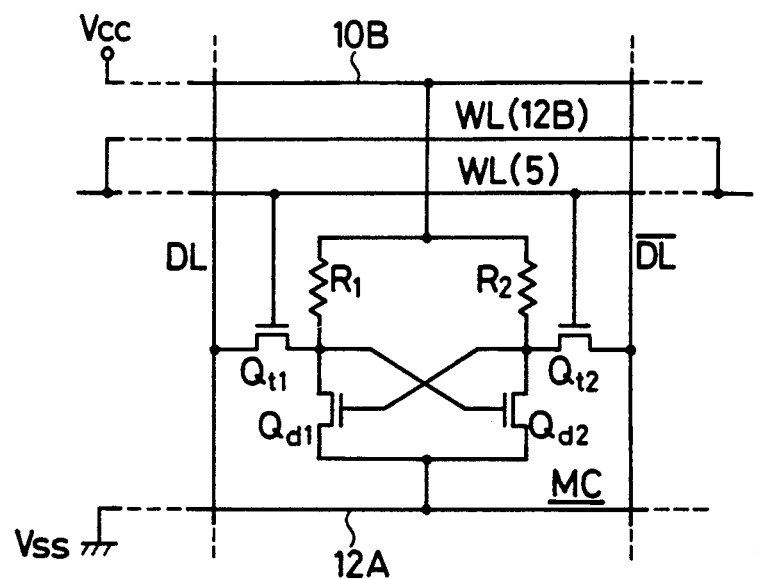
FIG. 1A is a circuit diagram of a memory cell of an SRAM in accordance with a first embodiment of the present invention.

FIG. 1A shows the circuit of a memory cell of an SRAM in accordance with a first embodiment of the present invention.

One memory cell MC of the SRAM is provided at the intersection between a pair of complementary data lines DL, $\overline{DL}$ and a first word line WL(5).

The memory cell MC comprises a flip-flop circuit and transfer (memory cell selecting) MISFETs Qt1 and Qt2 which are connected between a pair of input/output terminals of the flip-flop circuit and the complementary data lines DL, $\overline{DL}$, respectively. The first word line WL(5) is connected to the gates of the MISFETs Qt1 and Qt2. The flip-flop circuit (latch circuit) is defined by a pair of cross-coupled inverter circuits (in which the input terminal of one inverter is connected to the output terminal of the other inverter, and the input terminal of the latter is connected to the output terminal of the former) which are respectively constituted by high-resistance elements R1 and R2 serving as load elements and driving MISFETs Qd1 and Qd2. The input and output terminals of the flip-flop circuit are in common with each other. Each high-resistance element R is connected at one end thereof to a wiring 10B for supplying a power source voltage $V_{CC}$ to the memory cell and at the other end thereof to the drain region of the corresponding driving MISFET Qd. The source region of the driving MISFET Qd is connected to a wiring 12A for supplying a ground potential (reference voltage $V_{SS}$ to the memory cell.

The power source voltage wiring 10B is supplied with, for example, a power source voltage (operation voltage) $V_{CC}$ (=5 V) of the circuit, and the reference voltage wiring 12A is supplied with, for example, a ground voltage $V_{SS}$ (=0 V) of the circuit.

The first word line WL(5) is defined by the gate electrodes of the MISFETs Qt1 and Qt2 of each of a plurality of memory cells, the gate electrodes being integral with each other and extended. A second word line WL(12) extends in parallel with the first word line WL(5). According to the present invention, the second word line WL(12) is formed from the same level layer as that for forming the reference voltage wiring 12A.

Figure 1B:
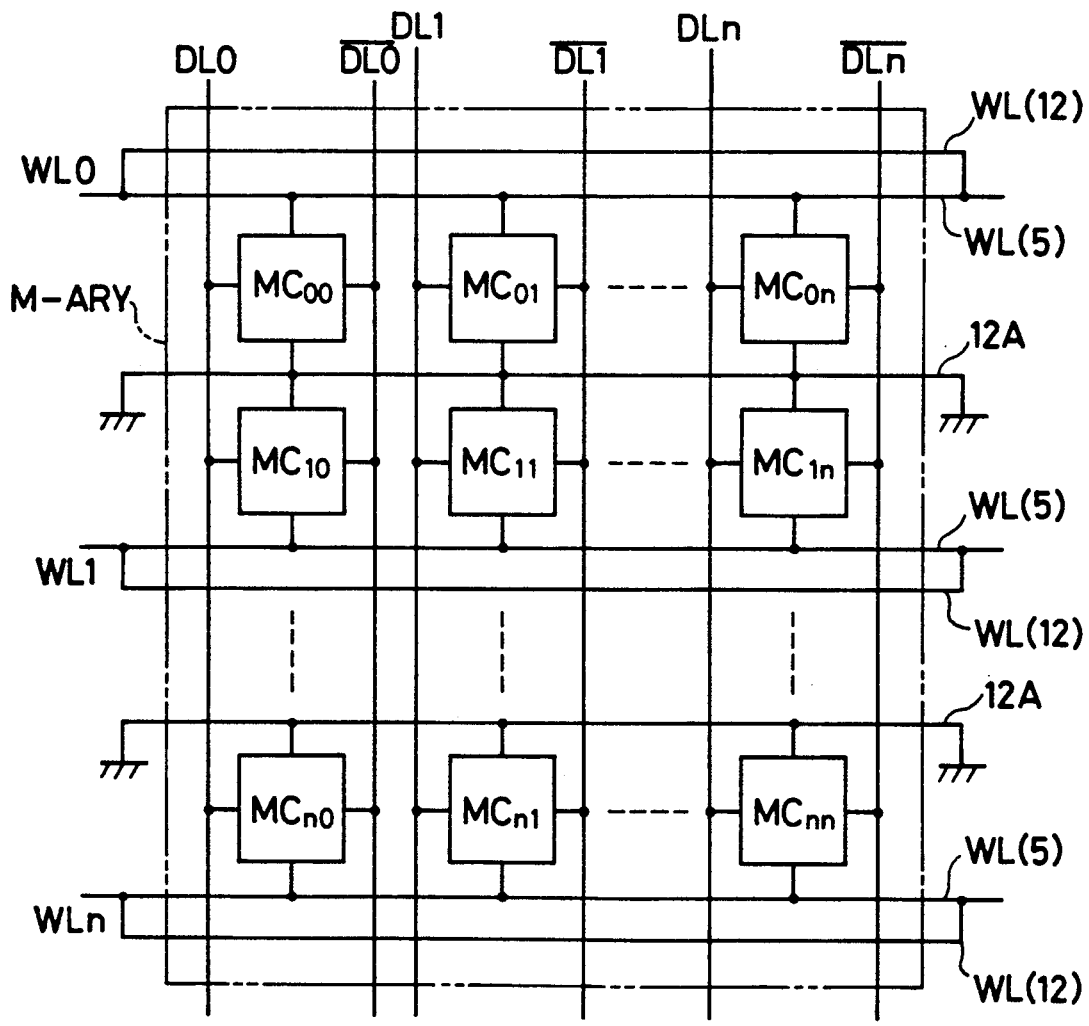
FIG. 1B is a conceptional view of a memory array of the SRAM according to the present invention.

As shown in FIG. 1B, a memory array M-ARY includes a plurality of first word lines WL(5), a plurality of complementary data lines DL, $\overline{DL}$, and a plurality of memory cells MC provided in correspondence with the intersections, respectively, between the word lines WL(5) and data lines DL, $\overline{DL}$.

In this embodiment, the corresponding first and second word lines WL(5) and WL(12) are shorted to each-at both ends thereof outside the memory array M-ARY. In other words, one first word line WL(5) is shunted by one second word line WL(12) for the purpose of reducing the resistance. In this embodiment, the corresponding first and second word lines WL(5) and WL(12) are supplied with the same word line selecting signal.

Figure 2A:
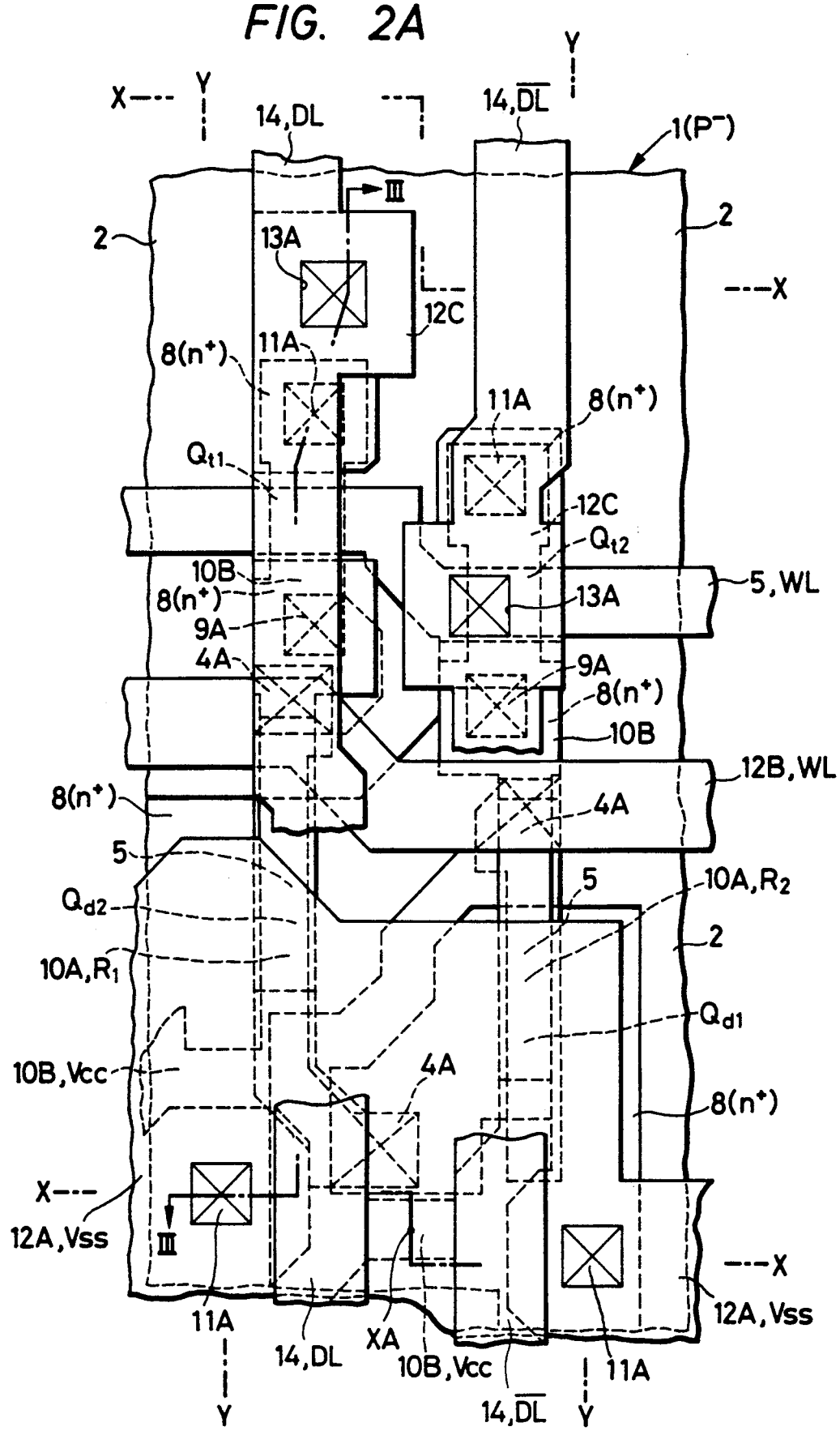
FIGS. 2A and 2B are a plan view and a conceptional view, respectively, of a memory cell of the SRAM in accordance with the first embodiment of the present invention.
Figure 2B:
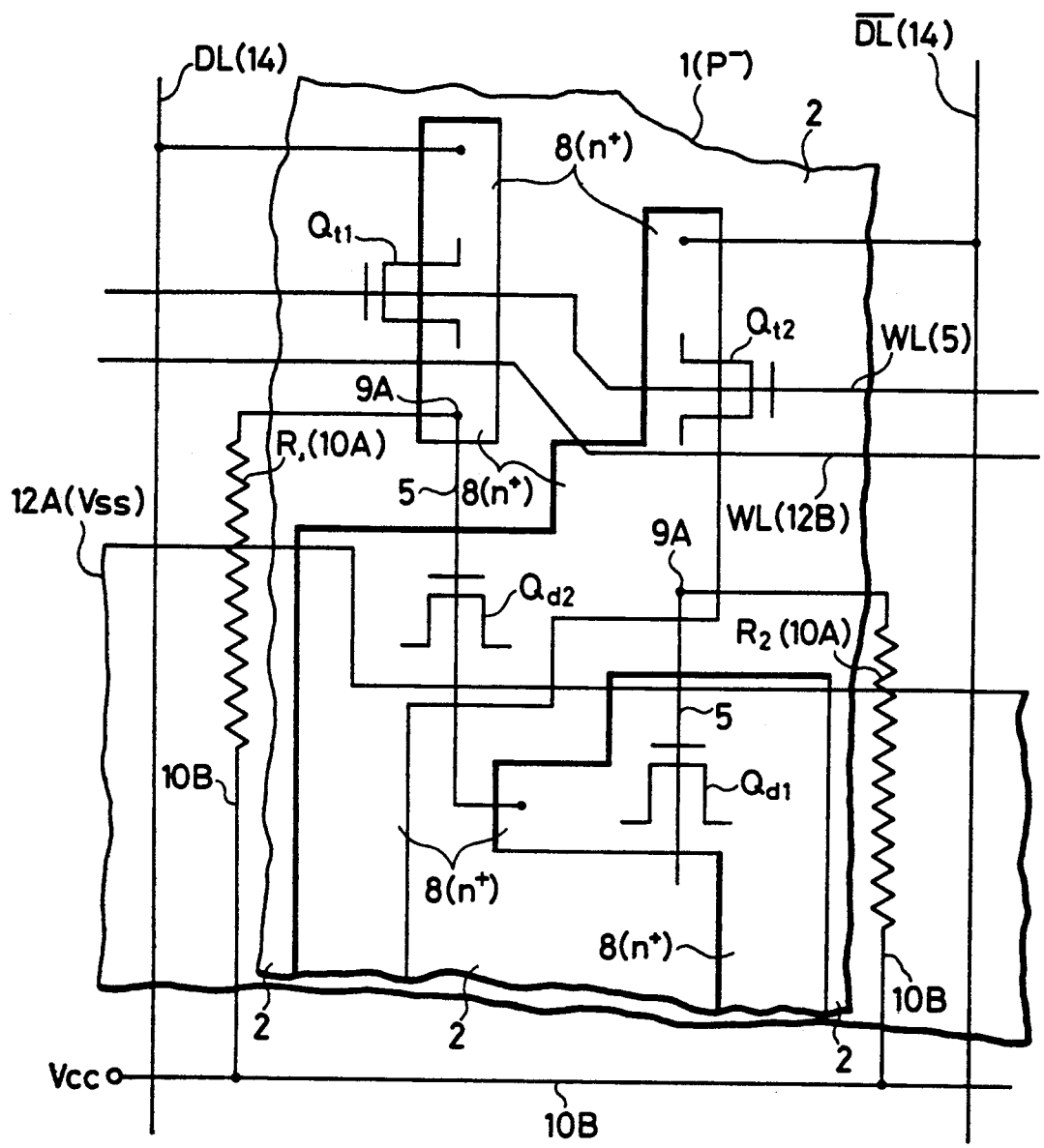
Figure 3:
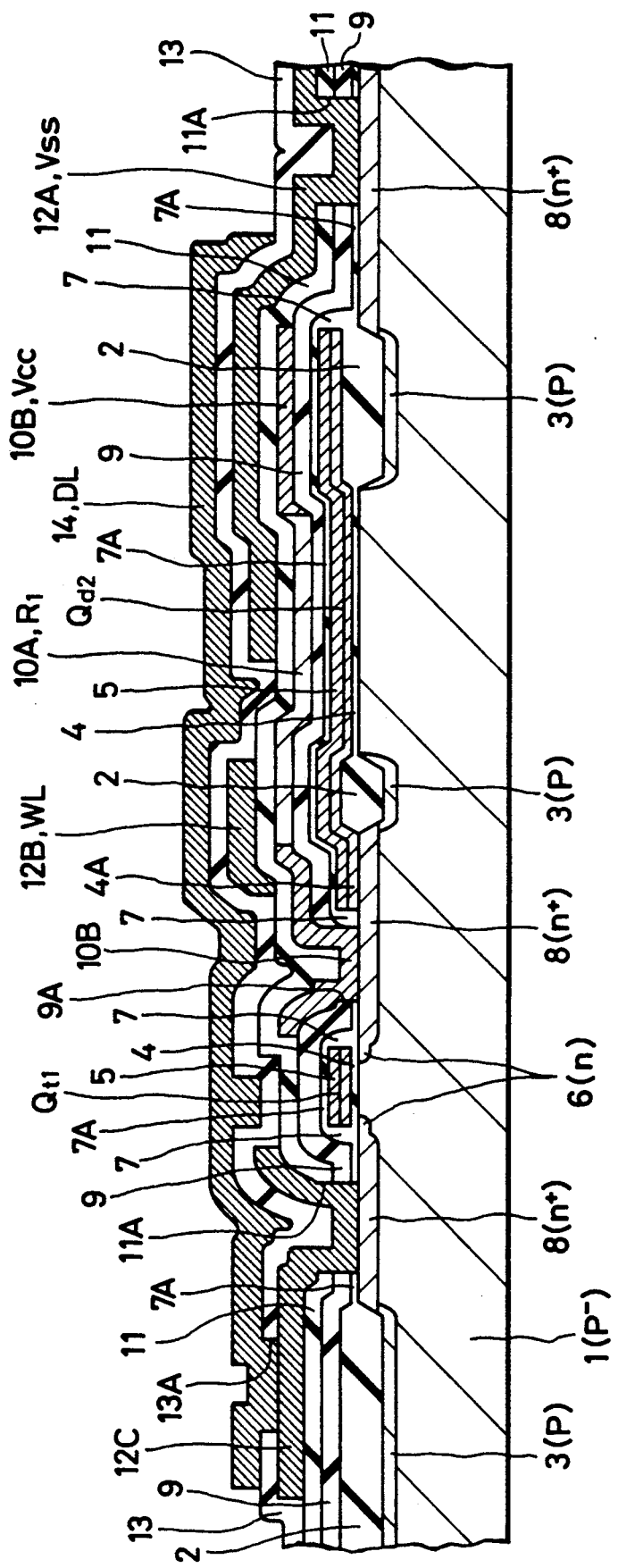
FIG. 3 is a sectional view taken along the line III—III in FIG. 2A.
Figure 4:
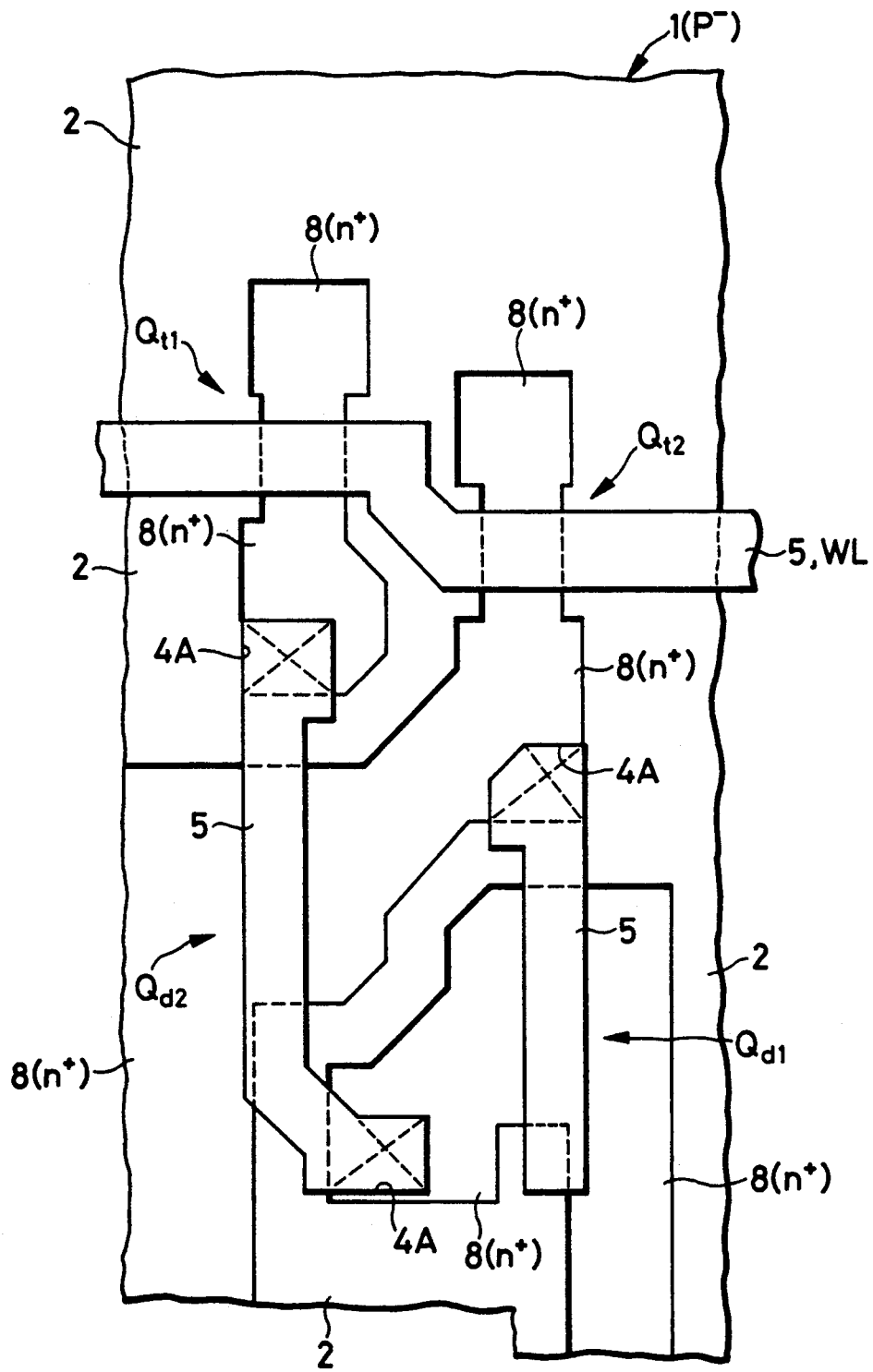
FIGS. 4 to 6 are plan views showing a part of a memory cell of the SRAM in accordance with the first embodiment of the present invention.
Figure 5:
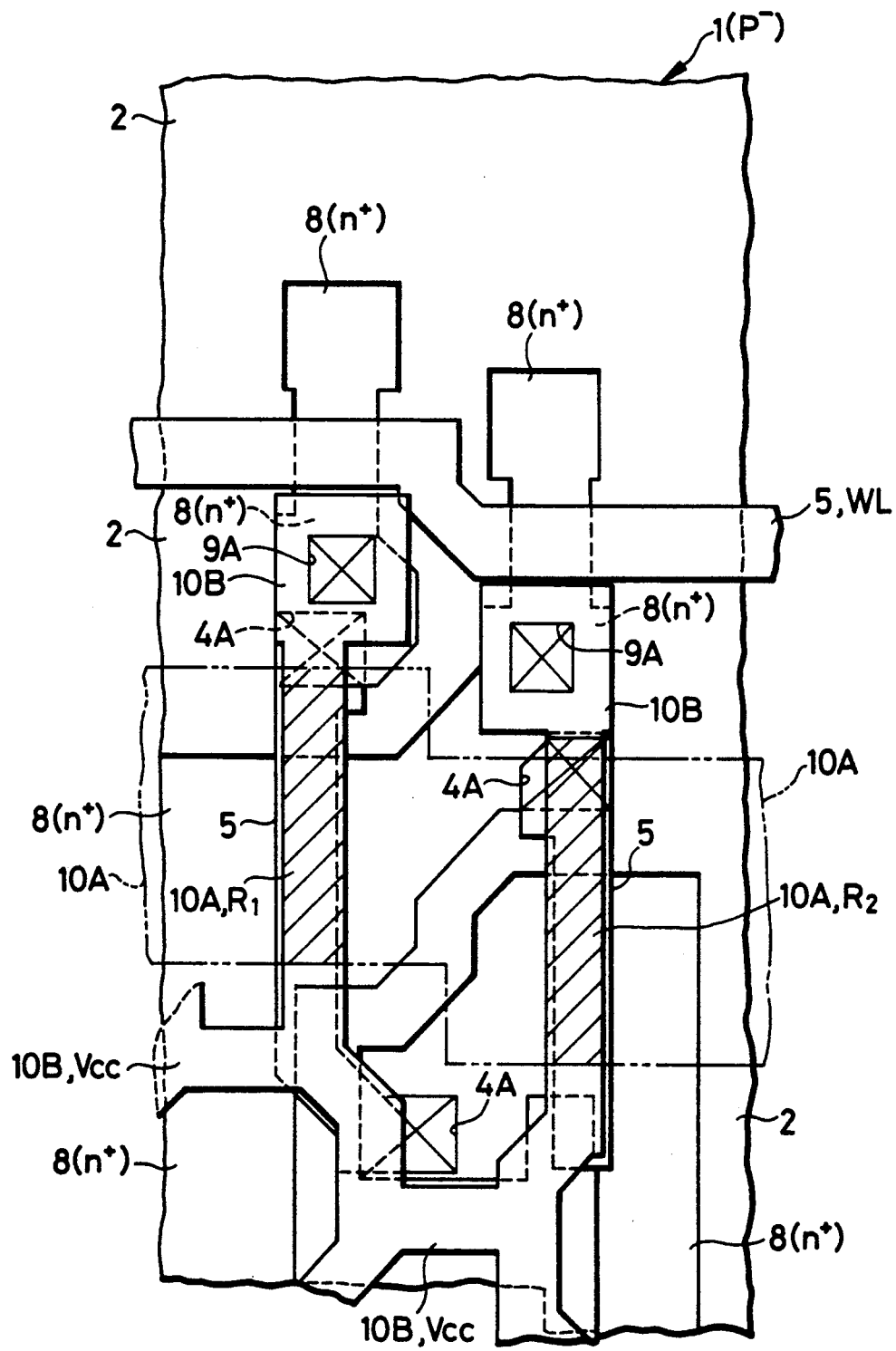
Figure 6:
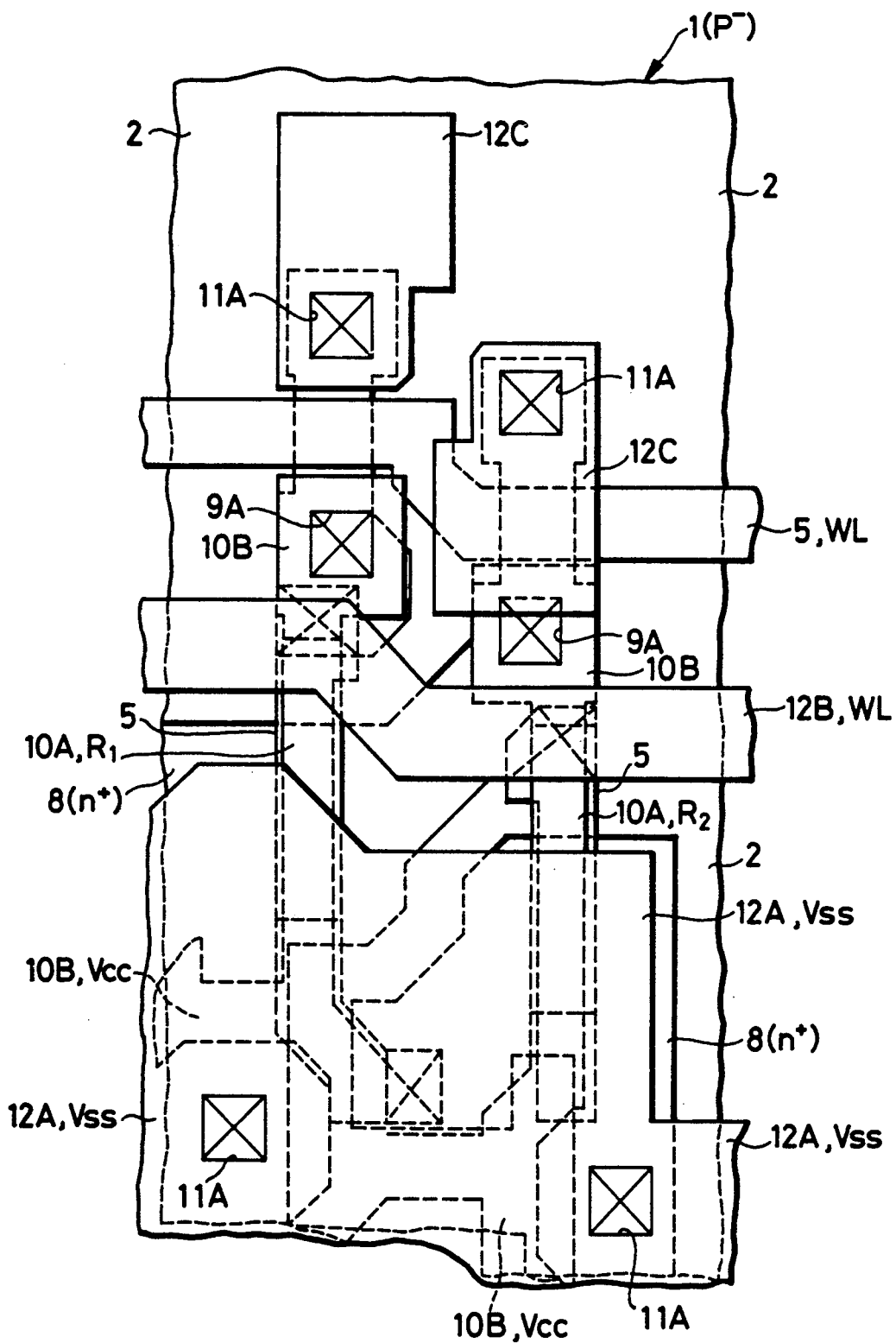

FIG. 2A (plan view) shows a memory cell of an SRAM in accordance with a first embodiment of the present invention, and FIG. 3 (sectional view) shows a cross-section of the memory cell taken along the line III—III in FIG. 2A. FIG. 2B, which corresponds to FIG. 2A, schematically shows this embodiment. FIGS. 4 to 6, which correspond to FIG. 2A, are plan views showing a part of one memory cell for the purpose of facilitating understanding of the configuration of each of the conductor layers shown in FIG. 2A. In FIGS. 4 to 6, in order to facilitate understanding of the arrangement of this embodiment, insulator films other than a field insulator film provided between each pair of adjacent conductor layers are not shown, and a part of each of the data lines DL and $\overline{DL}$ is omitted.

Referring to FIGS. 2A, 2B and 3, reference numeral 1 denotes a p⁻-type semiconductor substrate (or a well region) made of a single crystal silicon, 2 a field insulator film, and 3 p-type channel stopper regions.

The field insulator film 2 is, as shown in FIGS. 2, 3 and 4, provided over a main surface of the semiconductor substrate 1 in such a manner as to surround a region for forming each of the MISFETs Qt and Qd and thereby to define the configuration thereof. The field insulator film 2 defines regions for forming MISFETs Qt1 (or Qt2) and Qd1 (or Qd2) so that these MISFETs can be disposed separately from each other on a diagonal line in a substantially square memory cell forming region. The field insulator film 2 defines the MISFET forming regions so that the MISFETs Qt2 (or Qt1) and Qd2 (or Qd1) can be disposed integral with each other on a diagonal line which intersects the above-described diagonal line.

One memory cell is defined by X—X and Y—Y lines shown in FIG. 2A. More specifically, the upper and lower sides of the memory cell are defined by the X—X lines, respectively, and the left and right sides of the memory cell are defined by the Y—Y lines, respectively. Memory cells which are adjacent to the right and left of the illustrated memory cell are in symmetry with said memory cell with respect to the Y—Y lines, respectively, and memory cells are further disposed horizontally by repeating this pattern. For example, memory cells MC00 and MC01 shown in FIG. 1B are in symmetry with each other with respect to one Y—Y line. Memory cells which are adjacent to each other vertically are disposed in such a manner that they own jointly either a reference voltage wire 12A or a power source voltage line 10B. More specifically, a memory cell which is in symmetry with the memory cell shown in FIG. 2A with respect to a point XA on the lower X—X line in FIG. 2A owns the reference voltage line 12A (and the source region 8) in common with the illustrated memory cell. For example, the memory cells MC00 and MC10 shown in FIG. 1B are in this relation to each other. A pair of memory cells which are related to each other as described above define a unit, and the arrangement of this unit is repeated to dispose memory cells vertically.

The field insulator film 2 and other patterns are formed according to the rule of the above-described repetition.

The channel stopper regions 3 are provided in the main surface of the semiconductor substrate 1 under the field insulator film 2.

The field insulator film 2 and the channel stopper regions 3 electrically isolate semiconductor elements from each other.

MISFETs Qd1, Qd2, Qt1 and Qt2 which constitute in combination a memory cell as shown in FIG. 4 are provided on the main surface of a region of the semiconductor substrate 1 which is surrounded by the field insulator film 2 as described above. More specifically, each of the MISFETs Qd1, Qd2, Qt1 and Qt2 comprises the semiconductor substrate 1, a gate insulator film 4, a gate electrode 5, a pair of n-type semiconductor regions 6 and a pair of n⁺-type semiconductor regions 8, both defining source and drain regions.

The gate insulator film 4 is defined by a silicon oxide film formed on the main surface of the semiconductor substrate 1 by means of thermal oxidation.

The gate electrode 5 is defined by a polycide film which comprises a polycrystalline silicon film formed by CVD and a refractory metal silicide ($MoSi_2$, $TaSi_2$, $TiSi_2$ or $WSi_2$) film formed on the upper side of the polycrystalline silicon film by sputtering. The polycrystalline silicon film has an impurity (As and/or P) implanted therein for the purpose of lowering the resistance. The gate electrode 5 may be defined by a single-layer film constituted by a polycrystalline silicon film, a refractory metal (Mo, Ta, Ti or W) film or a refractory metal silicide film, or a composite film comprising a polycrystalline silicon film and a refractoty metal film provided thereon. In other words, the gate electrode 5 is formed from a conductor layer which contains a refractory metal and/or silicon.

As shown in FIG. 4, one end portion of the gate electrode 5 of the MISFET Qd1 is electrically connected to one semiconductor region 8 of the MISFET Qt2 through a contact hole 4A provided in the gate insulator film 4. Similarly, one end portion of the gate electrode 5 of the MISFET Qd2 is electrically connected to one region 8 of the MISFET Qt1 and to said one region 8 of the MISFET Qd1 through a contact hole 4A. More specifically, the gate electrodes 5 are employed as wirings for cross-coupling the two inverters, and no other wiring layer is employed for this purpose.

A word line (WL)5 is made from the same conductive material and the same conductor layer as those for the gate electrode 5. More specifically, the word lines 5 are formed integrally with the gate electrodes 5 of the MISFETs Qt1 and Qt2, and provided so as to extend in the direction of rows over the field insulator film 2.

The semiconductor regions 8 define heavily doped regions which serve as source and drains, respectively. The semiconductor regions 8 are formed by introducing an impurity by ion implantation using a mask (side wall spacers or side wall insulator films) 7 formed in self-alignment with and at the sides of the gate electrode 5.

The semiconductor regions 6 define lightly doped regions which serve as source and drain regions, respectively. The semiconductor regions 6, which are omitted in FIG. 4, are provided between the channel forming region of each of the MISFETs Qt and Qd and the semiconductor regions 8, thus forming a MISFET having the known LDD (Lightly Doped Drain) structure. These MISFETs may have other known structures such as single drain and double drain structure.

An insulator film 7A is provided so as to extend over the gate electrodes, the word lines 5 and the semiconductor regions 8. The insulator film 7A is defined by, for example, a silicon oxide film which is formed by CVD or thermal oxidation. An insulator film 9 is provided above the insulator film 7A so as to cover the MISFETs Qt and Qd. The insulator film 9 is defined by, for example, a silicon oxide film which is formed by CVD. Contact holes 9A are provided by removing the insulator films 7A and 9 above predetermined semiconductor regions 8.

The high-resistance elements ($R_1$, $R_2$) 10A are, as shown in FIGS. 2, 3 and 5 (plan views), provided on the insulator film 9 within a region surrounded by the two-dot chain line denoted by the reference numeral 10A. In other words, the two-dot chain line 10A shows the configuration of a mask made of a photoresist film used when an impurity is implanted for forming a wiring 10B (described later). No impurity is introduced into the region surrounded by the two-dot chain line 10A. One end portion of each of the high-resistance elements 10A is electrically connected to the semiconductor region 8 through the conductor layer 10B and the contact hole 9A, and the other end portion of the element 10A is electrically connected to the power source voltage wiring 10B which extends over the insulator film 9. The power source voltage wiring 10B is formed integrally with the high-resistance elements 10A from the same conductive material and by the same level conductor layer.

The high-resistance elements 10A and the power source voltage wiring 10B are formed from a polycrystalline silicon film (semiconductor). More specifically, the high-resistance elements 10A are formed from a polycrystalline silicon film having no impurity introduced therein for lowering the resistance as shown by the hatched lines in FIG. 5. The power source voltage wiring 10B is formed from a polycrystalline silicon film having, for example, an n-type impurity (As or P) introduced therein for the purpose of lowering the resistance. The power source voltage wiring 10B is formed by, for example, introducing arsenic (As) into an undoped polycrystalline silicon film at a dose of $5 \times 10^{15}$ atoms/cm$^2$ by an ion implantation technique.

As will be clear from FIGS. 2A, 3 and 5, the resistance elements $R_1$ and $R_2$ are formed substantially directly above the respective gate electrodes 5. Thus, a parasitic MISFET which comprises the gate electrode 5, the gate insulator film 9, the source and drain regions 10B and the channel region 10A is present in the memory cell. This first parasitic MISFET is effective in stabilizing the state of the flip-flop circuit constituting a memory cell and in performing a write operation at high speed.

It should be noted that the high-resistance elements 10A and the power source voltage wiring 10B may be formed from a single crystal silicon film or an amorphous silicon film formed on the insulator film 9.

An insulator film 11 is defined by, for example, a silicon oxide film formed by CVD and provided so as to cover the high-resistance elements 10A and the power source voltage wiring 10B. The insulator film 11 is provided with contact holes 11A by removing the insulator films 7A, 9 and 11 above the second semiconductor regions 8 of the MISFETs Qd and Qt.

The reference voltage wiring 12A is electrically connected to the semiconductor region 8 serving as a source of each MISFET Qd through the corresponding contact hole 11A, and provided so as to extend over the insulator film 11 in the same direction as that of the word lines 5. The reference voltage wiring 12A is, as shown in FIGS. 2A, 2B (shown by the dotted line), 3 and 6, formed so as to cover at least portions of the high-resistance elements ($R_1$ and $R_2$) 10A which are connected to the power source voltage wiring 10B, although not necessarily limited thereto. More specifically, the wiring 12A serves as a wiring for supplying a reference voltage (e.g., a circuit ground potential $V_{SS} = 0$ V) to the memory cell and also as a shield layer for shielding (reducing) the resistance elements 10A from the electric fields generated from other wiring layers (e.g., data lines DL and $\overline{DL}$), as described later.

In this embodiment, the reference voltage wiring 12A is formed from, for example, an aluminum film with or without an additive (Si or Cu) contained therein.

Thus, the wiring 12A which is supplied with a fixed potential is provided so as to cover the greater part of each high-resistance element 10A, whereby it is possible to reduce the influence of any field effect on the element 10A which is exerted by the layer (data lines) which is above the wiring 12A (shield effect). Accordingly, second parasitic MISFETs each having a gate electrode defined by a data line and a channel forming region defined by a high-resistance element 10A are prevented from turning ON, and therefore it is possible to stably maintain the high-resistance elements 10A at a high resistance level. The second parasitic MISFETs are formed from the insulator film 11 (and 13) which define gate insulator films, the data lines DL, $\overline{DL}$ (14) which define gate electrodes, the power source voltage wiring 10B which defines drain regions, and the conductor layer 10B which defines source regions. The threshold voltage can be set at a value which is higher than a voltage (e.g., 0 V to 5 V) applied to the data lines DL and $\overline{DL}$ which define the gate electrodes of the parasitic MISFETs. Accordingly, it is possible to prevent formation of any channel in the high-resistance elements 10A by the field effect of the data lines DL and $\overline{DL}$, and therefore it is possible to reduce variations (increase) in the amount of current flowing through the high-resistance elements 10A. Thus, it is possible to lower the power consumption of the SRAM.

The provision of the wirings 12A enables reduction of the influence of not only the field effect applied from the data lines DL, $\overline{DL}$ but also any high field effect produced from outside of the SRAM.

Since the wirings 12A are supplied with the reference voltage $V_{SS}$ and the potential thereof can stably be maintained even if the potential of the data lines varies, it is possible to further reduce variations in the threshold voltage of the parasitic MISFETs.

As the reference voltage wirings 12A are made from an electrically conductive material having a relatively small resistivity, such as an aluminum film, it is possible to increase the speed at which data stored in a memory cell is discharged (data clearing speed). Accordingly, it is possible to increase the speed of a data writing operation. Further, since it is possible to increase the speed at which data stored in a memory cell is discharged for a reason described above, it is possible to increase the difference between the data "1" (high level: about 4 V) and the data "0" (low level: 0 V), that is, a margin for making a determination as to whether the data is "1" or "0". Accordingly, the occurrence of a malfunction in a data reading operation can be prevented, and therefore it is possible to improve the electrical reliability of the SRAM.

Since the wiring layer 12A is adapted to perform the above-described two functions, the reference voltage wirings 12A are allowed to have a considerably large width. For this reason, it is possible to almost ignore the resistance of the wiring layer 12A, and this further enhances the above-described advantageous effect when the wiring layer 12A is viewed as lines for supplying a reference voltage to memory cells.

It should be noted that the threshold voltage of each second parasitic MISFET is determined by a pinch-off point near its drain region. Accordingly, the reference voltage wiring 12A should be provided so as to cover at least a portion of each high-resistance element 10A on the side thereof which is closer to the power source voltage wiring 10B as described above.

As shown in FIG. 6, a second word line (WL) 12B and a conductor layer 12C are provided using the same conductive material and the same layer as those for the reference voltage wiring 12A.

The second word line 12B is provided over the insulator film 11 so as to extend in the same direction as that of the reference voltage wiring 12A and the first word line 5. The second word line 12B is defined by a first-level aluminum layer.

Thus, the first word line 5 is connected (shunted) to the second word line 12B having a smaller resistivity than that of the former, and this enables a reduction in resistance of the word lines as a whole, so that it is possible to increase the speed of data writing and reading operations.

Since the second word line 12B is formed from the same level layer as that for forming the reference voltage line 12A, the manufacturing process is not complicated.

The second word line 12B is provided at a position where it does not overlap the first word line 5 in order to prevent shorting between the second word line 12B and the conductor layer 12C. To contrive this without any increase in the memory cell area, the second word line 12B is disposed above the conductor layer 10B and the resistance element 10A. In order to realize this disposition, the wiring layer 12A serving as a shield layer is not formed on a part of the resistance element 10A.

In the memory array M-ARY, each word line 12B may be shorted to the corresponding first word line 5 through contact holes which are provided in the insulator film 11 for each memory cell or each group of a predetermined number (e.g., 8, 16 or 32) of memory cells disposed in the row direction.

One end portion of the conductor layer 12C is electrically connected to the other semiconductor region 8 of each MISFET Qt through a contact hole 11A, and the other end portion of the layer 12C is provided so as to extend over the insulator film 11. The conductor layer 12C electrically connects said semiconductor region 8 of each MISFET Qt and a data line DL (or $\overline{DL}$). More specifically, the conductor layer 12C is formed for the purpose of reducing the step of the contact hole for connecting both of them and thereby improving the step coverage of the data lines DL and $\overline{DL}$ made of aluminum.

An insulator film 13 is defined by, for example, a silicon oxide film formed by CVD, and provided so as to cover the reference voltage wiring 12A, the word line 12B and the conductor layer 12C. A contact hole 13A is provided by removing the insulator film 13 over the conductor layer 12C.

Data lines (DL and $\overline{DL}$) are 14 electrically connected to the conductor layer 12C through the contact holes 13A, and provided so as to extend over the insulator film 13 in the column direction. The data lines 14 are formed using the same conductive material (aluminum) as that for the reference voltage wiring 12A.

Thus, the SRAM in accordance with this embodiment is constituted by two-level low-resistance wirings made from aluminum films. The first-level low-resistance wiring layer defines the reference voltage wiring 12A, the word line 12B and the conductor layer 12C, and the second-level low-resistance wiring layer defines the data lines 14.

Figure 7:
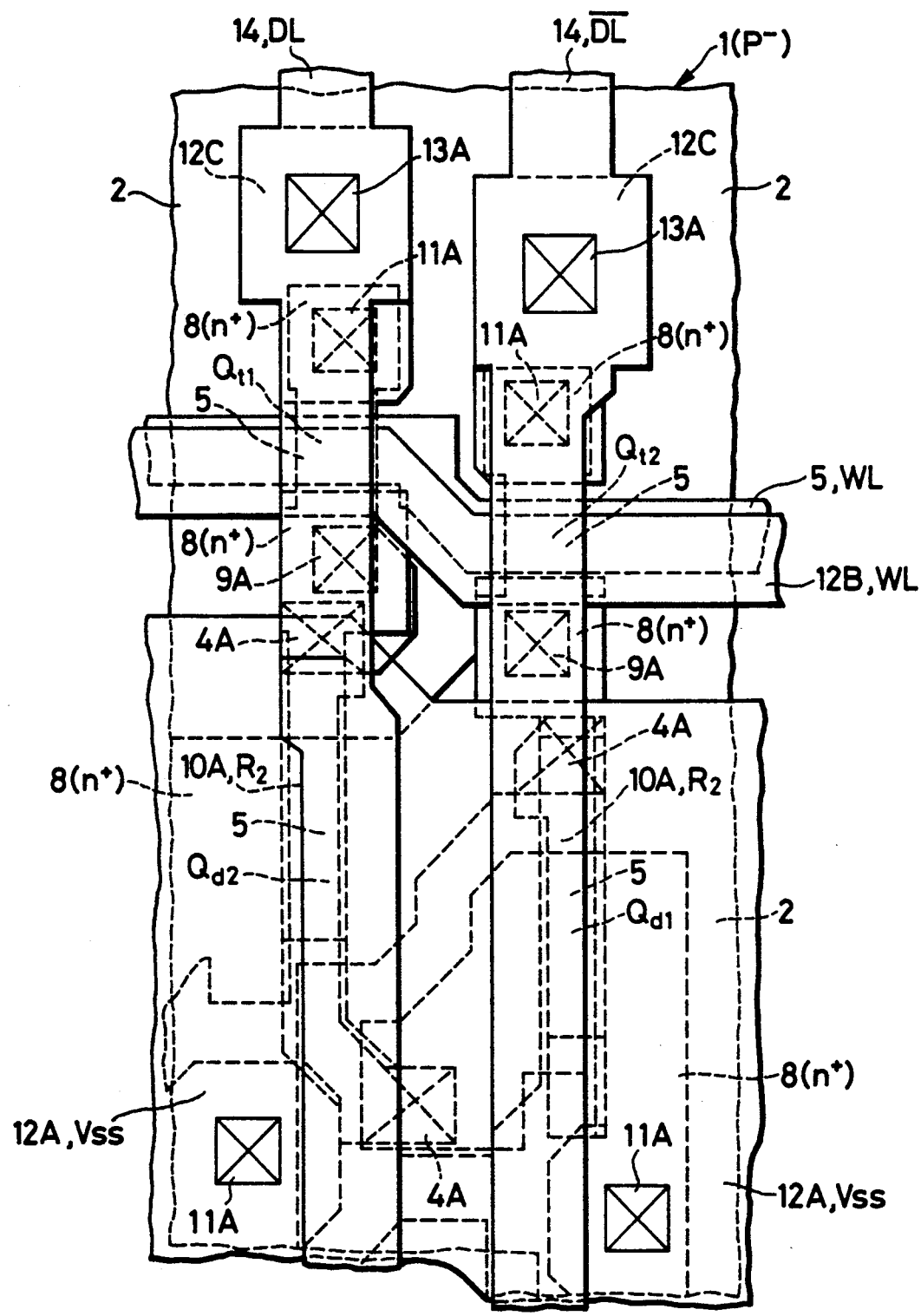
FIG. 7 is a plan view of a memory cell of an SRAM in accordance with another embodiment of the present invention.

FIG. 7 shows another embodiment of the present invention in which the influence of the field effect exerted from the data lines and the like is further reduced in each memory cell of the SRAM, and the resistance of the word line in each memory cell is lowered.

The memory cell shown in FIG. 7 differs from that shown in FIG. 2A in the following points.

In the memory cell shown in FIG. 7, the second word line 12B is positioned so as to be substantially laid over the first word line 5, and the reference voltage wiring 12A is extended to a region where it is not shorted to the second word line 12B. For this purpose, one of the conductor layers 12C (which is closer to the data line $\overline{DL}$, in this embodiment) is extended on the side of the memory cell which is remote from the first word line 5. More specifically, the conductor layer 112C which is extended over the first word line 5 in the memory cell shown in FIG. 2A is formed on the opposite side. As a result, the reference voltage wiring 12C can be formed so as to cover almost all of the areas of the high-resistance elements ($R_1$ and $R_2$) 10A.

Provision of the reference wiring 12A so as to cover almost all the areas of the high-resistance elements 10A as described above enables further reduction of the influence of the field effect exerted from the outside of the device, and therefore it is possible to prevent occurrence of a malfunction of the internal circuits and lower the power consumption of the SRAM.

It should be noted that in this embodiment the conductor layer 12C provided on the data line $\overline{DL}$ side increases the memory cell area as compared with that of the memory cell shown in FIG. 2A.

The novel technique disclosed in this application provides the following advantages.

(1) In each memory cell, a second word line is connected in parallel to a first word line, and this enables a reduction in resistance of the word lines as a whole. In particular, when the second word line is made of a material (e.g., aluminum) which has a lower resistance than that of a material for the first word line, the advantageous effect is enhanced.

(2) Since the second word line is formed over the memory cell, it is possible to increase the operation speed without any increase in the memory cell area.

(3) Since the reference voltage wiring is formed so as to extend over elements constituting the memory cell, the width of the wiring can be enlarged. Thus, it is possible to obtain a wiring having a considerably low resistance in conjunction with the use of a material having a relatively low resistance, such as aluminum. Accordingly, it becomes unnecessary to reduce the resistance by connecting (shunting) this reference voltage wiring to another wiring layer.

(4) Since the second word line and the reference voltage wiring are made from layers on the same level (layers formed in the same manufacturing step), the manufacturing process is not complicated.

(5) In an SRAM having memory cells each having semiconductor resistance elements, a conductor layer (shield layer) for reducing the influence of the field effect exerted from data lines and the like is provided so as to cover the semiconductor resistance elements. It is therefore possible to reduce variations in the amount of current flowing through the semiconductor resistance elements. Thus, the power consumption can be lowered.

(6) Since a fixed potential which is applied to the shield layer is a reference potential, the potential of the shield layer can be stabilized.

(7) Since the shield layer is defined by a reference voltage wiring, it is possible to form the shield layer and enlarge the width of the reference voltage wiring without any increase in the memory cell area.

(8) Since the reference voltage wiring has an enlarged width and is made of a material having a relatively low resistance, it is possible to increase the speed at which charges in a stage node discharge, particularly, at the reference voltage wiring. Accordingly, it is possible to increase the speed of a data wiring operation. Thus, a data determination margin can be increased, and therefore it is possible to prevent the occurrence of a malfunction in a data reading operation and improve the electrical reliability.

(9) Since the data, word and reference voltage wirings are made of a conductive material having a relatively small resistivity, i.e., aluminum, it is possible to increase the speed of data writing and reading operations.

Although the invention accomplished by the present inventors has practically been described by way of the embodiments, it should be noted here that the invention is not necessarily limited to the described embodiments and various changes and modifications may, of course, be imparted thereto without departing from the scope and spirit of the invention.

Each second word line may be provided in correspondence with a plurality of first word lines, e.g., 2, 4, 8 or 16 first word lines. In such case, the second word lines are formed in regions other than those which are located over memory cells.

Figure 8A:
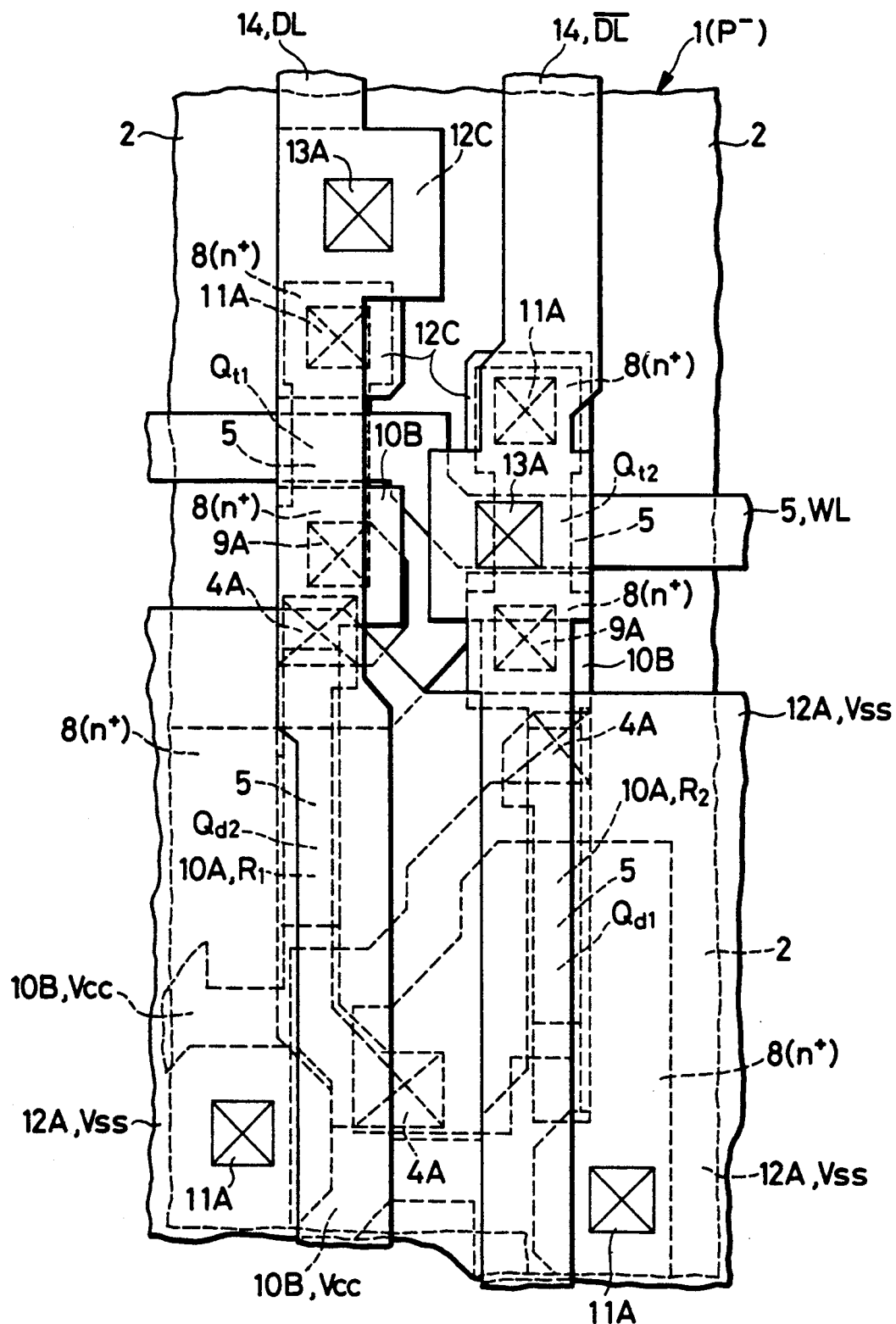
FIGS. 8A and 8B show still another embodiment of the present invention.
Figure 8B:
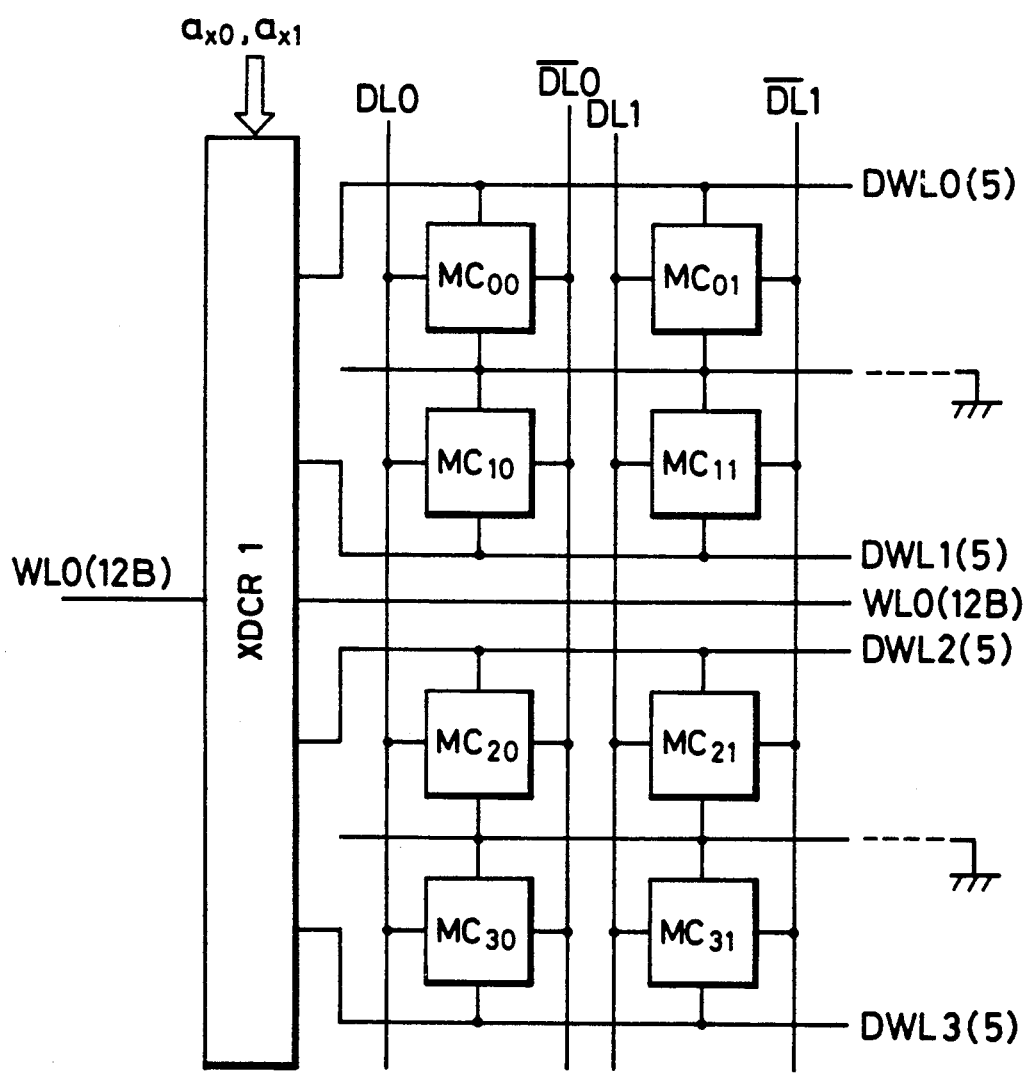

FIGS. 8A and 8B show in combination still another embodiment in which one second word line is formed in correspondence with four first word lines.

As shown in FIG. 8A, the second word line which is made from the second-level aluminum layer is not formed directly above the memory cell. Making use of this arrangement, the reference voltage wiring 12A which is made from the same level layer as that for forming the second word line is formed in the same pattern as in the embodiment shown in FIG. 7. More specifically, the reference voltage wiring 12A is provided so as to cover almost all the areas of the high-resistance elements ($R_1$ and $R_2$). 10A. Since this arrangement enables further reduction of the influence of the field effect exerted from the data lines or from outside of the device, it is possible to prevent the occurrence of a malfunction of the internal circuits and lower the power consumption of the SRAM. Similarly, making use of the fact that no second word line is present in the region directly above the memory cell, the conductor layer 12C is formed in the same pattern as that in the embodiment show in FIG. 2A (FIG. 6). Thus, it is possible to reduce the power consumption without any fear of the memory cell area increasing as in the case of the arrangement shown in FIG. 7.

FIG. 8B shows the relationship between the second word lines (12B) made from a second-level aluminum layer and the first word lines 5. In FIG. 8B, the first word lines are shown as subsidiary word lines or divided word lines DWL in order to discriminate them from the second word lines WL. Memory cells MC are formed in correspondence with the intersections, respectively, between the first word lines DWL and the complementary data lines DL, $\overline{DL}$.

A second row decoder (not shown) forms a signal for selecting a second word line WL on the basis of bits constituting a row address signal other than two bits among them. A first row decoder XDCR1 forms a signal selecting a first word line DWL on the basis of the second-word line selecting signal and two bits ax0 and ax1 in the row address signal. The signal for selecting a second word line WL which is a main word line is employed as a signal common to a plurality of first row decoders. Since the second word lines have a relatively low resistance and the parasitic capacitances added thereto are relatively small, it is possible to achieve a higher speed operation. The arrangement in which one second word line corresponds to a plurality of first word lines in a semiconductor memory is disclosed in, for example, U.S. patent application Ser. No. 685,398 filed on Feb. 25, 1985 cited as a reference in this specification.

The second word lines and the reference voltage wiring may be formed from any layer other than the first level aluminum layer.

The second word lines and the reference voltage wirings may be made from the second-level aluminum layer. In this case, the data lines are formed from the first-level aluminum layer. The conductor layer for connection between the data lines and the semiconductor regions 8 is not formed, or it is defined by the conductor layer 10B. Similarly, for connection between the reference voltage wiring and the semiconductor regions 8, a conductor layer made from the first-level aluminum layer is preferably formed in a manner similar to that of the conductor layers 12C.

In each of the embodiments respectively shown in FIGS. 2A, 7, 8A and 8B, the conductor layer for connection between the data lines and the semiconductor regions 8 may not be formed.

The above-described SRAM may be produced according to, for example, the method disclosed in U.S. patent application Ser. No. 764,208 filed on Aug. 8, 1985 which is cited as a reference in this specification. The second-level polycide and aluminum layers may be formed according to the same methods and conditions as those for the first-level polycide and aluminum layers, respectively. In addition, an intermediate insulator film formed between each pair of adjacent conductor layers may be formed according to a method similar to the above.

The present invention may be applied to an SRAM having memory cells each including a flip-flop circuit which is constituted by complementary MISFETs. In particular, when p-channel MISFETs are formed using a (polycrystalline) silicon film formed on a substrate, a reference voltage wiring for reducing the influence of the field effect exerted from the data lines or the like may be formed so as to cover the silicon film.

The present invention may also be applied to an SRAM having memory cells in which high-resistance elements are formed in such a manner as to be buried in slits provided in a semiconductor substrate. In such case, a power source voltage may be supplied from the substrate side to the memory cells, and second word lines and a reference voltage wiring may be formed from a conductor layer (aluminum film or the like) having a relatively small resistivity.

The present invention may also be applied to an SRAM including a memory cell having no resistors $R_1$ and $R_2$ in the circuit shown in FIG. 1. The configuration of the memory cell shown in FIG. 9 to which data lines (shown in FIG. 2A) are added. In such case, no area is needed for connection between the resistors $R_1$ and $R_2$ and the respective regions 8, so that it is possible to reduce the entire area correspondingly.

In the present invention, peripheral circuits such as decoders and input/output buffers may be defined by so-called Bi-CMOS circuits including bipolar transistors and complementary MISFETs. In particular, when the bipolar transistors are operated on the ECL (Emitter-Coupled Logic) level for the purpose of achieving high speed, the power source voltage $V_{CC}$ and the ground potential $V_{SS}$ in each of the above-described embodiments are replaced by the ground potential $V_{SS}$ and a negative power source voltage $V_{EE}$, respectively.

The described embodiments may be combined to each other. For example, in the embodiment shown in FIG. 8A, the data lines may be formed from the first-level aluminum layer, and the second word line and the reference voltage line may be formed from the second-level aluminum layer.

Circuit elements such as MISFETs and resistors which constitute each memory cell may be variously modified or changed.

The present invention may widely be applied not only to SRAMS but also to semiconductor memory devices having word lines and reference voltage lines for memory cells, such as mask-programmed ROMs (Read Only Memories) and electrically programmable ROMs (EPROMS).

What is claimed is:

1. A semiconductor memory device comprising:
    data lines which extend in a column direction over a semiconductor substrate and which are constituted as individual sets of complementary data lines, each set including a pair of complementary data lines and each data line of a corresponding pair of complementary data lines being coupled to an identical memory cell;
    a plurality of memory cells each of which comprises cross-coupled first and second driver MISFETs and first and second switching MISFETs, each one of said first and second switching MISFETs being coupled between a respective one of said first and second driver MISFETs and a data line of a pair of complementary data lines associated therewith;
    load elements which are respectively coupled to said first and second driver MISFETs of each memory cell, each of said data lines extending in substantially the same direction as that of said load elements and being formed above said semiconductor substrate and positioned so as to be substantially aligned over said load elements such that a projection of each data line in the direction of said semiconductor substrate would fall on a load element associated therewith; and
    wirings for supplying a ground potential to said plurality of memory cells, said wirings being disposed as a wiring layer between said load elements of each one of said plurality of memory cells and each pair of data lines respectively associated therewith and being formed so as to cover said load elements.

2. A semiconductor memory device according to claim 3, wherein each one of said load elements includes a high resistance portion, and each wiring associated therewith for supplying said ground potential is formed so as to cover at least a part of said high-resistance portion.

3. A semiconductor memory device according to claim 2, wherein said load elements are made of polycrystalline silicon, said wiring layer is comprised of a first-level aluminum layer, and said data line is comprised of a second-level aluminum layer.

4. A semiconductor memory device according to claim 3, wherein said high-resistance portion is substantially a non-doped portion.

5. A semiconductor memory device according to claim 1, wherein said semiconductor memory device further comprises:
    first word lines which extend in a row direction over said semiconductor substrate; and
    second word lines which extend in said row direction, wherein said second word lines are formed above said first word lines and are comprised of a layer which is the same level layer as said wiring layer.

6. A semiconductor memory device according to claim 5, wherein said second word lines and said wiring layer are comprised of a first-level aluminum layer, and said second word lines are electrically shorted to said first word lines.

7. A semiconductor memory device according to claim 6, wherein said first word lines are made of a double-layer film comprising a first film of polycrystalline silicon and a second film of a silicide formed as a compound of silicon and a refractory metal.

8. A semiconductor memory device comprising:
    data lines which extend in a column direction over a semiconductor substrate and which are constituted as individual sets of complementary data lines, each set including a pair of complementary data lines and each data line of a corresponding pair of complementary data lines being coupled to an identical memory cell;
    a plurality of memory cells each of which comprises cross-coupled first and second driver MISFETs and first and second switching MISFETs, each one of said first and second switching MISFETs being coupled between a respective one of said first and second driver MISFETs and a data line of a pair of complementary data lines associated therewith;
    load elements which are respectively coupled to said first and second driver MISFETs of each memory cell, each of said data lines extending in substantially the same direction as that of said load elements and being formed above said load elements and positioned so as to be substantially aligned over said load elements such that a projection of each data line in the direction of said semiconductor substrate would fall on a load element associated therewith, and wherein each one of said load elements has a high-resistance portion; and wirings for supplying a ground potential to said plurality of memory cells, said wirings being disposed as a wiring layer between said load elements of each one of said plurality of memory cells and each pair of data lines respectively associated therewith and each wiring being formed so as to cover at least a part of the high-resistance portion of said load elements of each memory cell it supplies said ground potential thereto.

9. A semiconductor memory device according to claim 8, wherein said load elements are made of polycrystalline silicon, said wiring layer is comprised of a first-level aluminum layer, and said data line is comprised of a second-level aluminum layer.

10. A semiconductor memory device according to claim 9, wherein said high-resistance portion is substantially a non-doped portion.

11. A semiconductor memory device according to claim 8, wherein said semiconductor memory device further comprises:
first word lines which extend in a row direction over said semiconductor substrate; and
second word lines which extend in said row direction, wherein said second word lines are formed above said first word lines and are comprised of a layer which is the same level layer as said wiring layer.

12. A semiconductor memory device according to claim 11, wherein said second word lines and said wiring layer are comprised a first-level aluminum layer, and said second word lines are electrically shorted to said first word lines.

13. A semiconductor memory device according to claim 12, wherein said first word lines are made of a double-layer film comprising a first film of polycrystalline silicon and a second film of a silicide formed as a compound of silicon and a refractory metal.

14. A semiconductor memory device comprising:
first word lines which extend in a row direction over a semiconductor substrate;
second word lines which extend in said row direction, and which are formed above said first word lines;
data lines which extend in a column direction over said semiconductor substrate and which are constituted as individual sets of complementary data lines, each set including a pair of complementary data lines and each data line of a corresponding pair of complementary data lines being coupled to an identical memory cell;
a plurality of memory cells each of which comprises cross-coupled first and second driver MISFETs and first and second switching MISFETs, each one of said first and second switching MISFETs being coupled between a respective one of said first and second driver MISFETs and a data line of a pair of complementary data lines associated therewith;
load elements which are respectively coupled to said first and second driver MISFETs of each memory cell, each of said data lines extending in substantially the same direction as that of said load elements and being formed above said load elements and positioned so as to be substantially aligned over said load elements such that a projection of each data line in the direction of said semiconductor substrate would fall on a load element associated therewith; and wirings for supplying a ground potential to said memory cells, said wirings being disposed as a wiring layer between said load elements of each one of said plurality of memory cells and each pair of data lines respectively associated therewith and being formed to cover said load elements, said wiring layer being comprised of a layer which is the same level layer as said second word line.

15. A semiconductor memory device according in claim 14, wherein each one of said load elements includes a high-resistance portion, and each wiring associated therewith for supplying said ground potential is formed so as to cover at least a part of said high-resistance portion.

16. A semiconductor memory device according to claim 15, wherein said load elements are made of polycrystalline silicon, and said wiring layer is composed of a first-level aluminum layer, said data line is comprised of a second-level aluminum layer.

17. A semiconductor memory device according to claim 16, wherein said high-resistance portion is substantially a non-doped portion.

18. A semiconductor memory device according to claim 16, wherein said second word lines are electrically shorted to said first word lines.

19. A semiconductor memory device according to claim 18, wherein said first word lines are made of a double-layer film comprising a first film of polycrystalline silicon and a second film of a silicide formed as compound of silicon and a refractory metal.

20. A semiconductor memory device comprising:
first word lines which extend in a row direction over a semiconductor substrate;
second word lines which extend in said row direction, and which are formed above said first word lines;
data lines which extend in a column direction over said semiconductor substrate and which are constituted as individual sets of complementary data lines, each set including a pair of complementary data lines and each data line of a corresponding pair of complementary data lines being coupled to an identical memory cell;
a plurality of memory cells each of which comprises cross-coupled first and second driver MISFETs and first and second switching MISFETs, each one of said first and second switching MISFETs being coupled between respective ones of first and second driver MISFETs and a data line of a pair of complementary data lines associated therewith;
load elements which are respectively coupled to said first and second driver MISFETs of each memory cell, each of said data lines extending in substantially the same direction as that of said load elements and being formed above said load elements and positioned so as to be substantially aligned over said load elements such that a projection of each data line in the direction of said semiconductor substrate would fall on a load element associated therewith, and wherein each one of said load elements has a high-resistance portion; and wirings for supplying a ground potential to said memory cells, said wirings being disposed as a wiring layer between said load elements of each one of said plurality of memory cells and each pair of data lines respectively associated therewith and each wiring being formed so as to cover at least part of the high-resistance portion of said load elements of said memory cell it supplies said ground potential thereto, said wiring layer being comprised of a layer which is the same level layer as said second word line.

21. A semiconductor memory device according to claim 20, wherein said load elements are made of polycrystalline silicon, and said wiring layer is composed of a first-level aluminum layer, said data line is comprised of a second-level aluminum layer.

22. A semiconductor memory device according to claim 21, wherein said high-resistance portion is substantially a non-doped portion.

23. A semiconductor memory device according to claim 21, wherein said second word lines are electrically shorted to said first word lines.

24. A semiconductor memory device according to claim 23, wherein said first word lines are made of a double-layer film comprising a first film of polycrystalline silicon and a second film of a silicide formed as a compound of silicon and a refractory metal.

25. A semiconductor device comprising:
at least one pair of complementary data lines which extend in a column direction over a semiconductor substrate;
at least first and second memory cells adjacently disposed along said column direction and between said pair of complementary data lines each of which including a pair of cross-coupled driver transistors and a pair of load elements which are series coupled therewith, respectively, between wiring for supplying a ground reference potential and a supply potential wiring, and first and second switching means each of which being coupled between a respective one of said pair of driver transistors and a respective one of said pair of complementary data lines wherein each data line of said complementary data line pair extends in substantially the same direction as that of said load elements and is formed above said semiconductor substrate and positioned so as to be substantially aligned over a corresponding one of the load elements of said first and second memory cells such that a projection of each data line of said complementary data line pair in the direction of said semiconductor substrate would fall on a load element of said first and second memory cells;
wherein said wiring for supplying the ground reference potential is disposed as a wiring layer between the load elements of said first and second memory cells and said complementary data line pair and is formed so as to cover at least a part of the load elements of said first and second memory cells; and
wherein said first and second memory cells are symmetrically disposed along said column direction about a central location therebetween as determined by the supply potential wiring associated therewith, said supply potential wiring being such that it is apportioned within said column direction so as to extend to locations, with respect to said central location, corresponding to said first and second memory cells on said semiconductor substrate for providing said supply potential to the respective load elements thereat, and wherein said supply potential wiring extends along a row direction which is an orthogonal direction to said column direction through said central location.

26. A semiconductor device according to claim 25, wherein said wiring for supplying the ground reference potential includes a single wiring layer corresponding associated with said first and second memory cells, extending in said row direction, so as to cover at least a pair of the load elements thereof.

27. A semiconductor device according to claim 26, wherein each one of said load elements includes a high-resistance portion, and wherein said wiring layer is formed so as to cover a part of the high-resistance portion of each of said load elements.

28. A semiconductor device according to claim 27, wherein said wiring layer is formed so as to further cover said supply potential wiring.

29. A semiconductor device according to claim 28, wherein said load elements and said supply potential wiring correspond to a same level layer above said semiconductor substrate.

30. A semiconductor device according to claim 29, wherein said first and second memory cells are SRAM MISFET type memory cells of a SRAM array wherein said pair of driver transistors and said first and second switching means are MISFETs and wherein the switching MISFETs are controlled by a corresponding row word line.

31. A semiconductor device according to claim 30, wherein each column of said SRAM array includes a plurality of symmetrically arranged first and second memory cells in said column direction about a respective central location therebetween as determined by a corresponding supply potential wiring associated therewith which is formed along said row direction, each memory cell in a column direction being associated with a different row in said SRAM array.

32. A semiconductor device according to claim 31, wherein said wiring for supplying a ground reference potential includes a plurality of same level wiring layers, each one corresponding to a ground reference potential wiring of all of the first and second memory cells of a respective pair of adjacent rows of said SRAM array.

33. A semiconductor device according to claim 25, wherein said first and second memory cells are SRAM MISFET type memory cells of a SRAM array wherein said pair of driver transistors and said first and second switching means are MISFETs and wherein the switching MISFETs are controlled by a corresponding row word line.

34. A semiconductor device according to claim 33, wherein each column of said SRAM array includes a plurality of symmetrically arranged first and second memory cells in said column direction about a respective central location therebetween as determined by a corresponding supply potential wiring associated therewith which is formed along said row direction, each memory cell in a column direction being associated with a different row in said SRAM array.

35. A semiconductor device according to claim 34, wherein said wiring includes a plurality of same level wiring layers, each one corresponding to a ground reference potential wiring of all of the first and second memory cells of a respective pair of adjacent rows of said SRAM array.

36. A semiconductor device according to claim 35, wherein each one of said load elements includes a high-resistance portion, and wherein said wiring layer is formed so as to substantially cover the entire high-resistance portion of each of said load elements.

37. A semiconductor device comprising:
data lines which extend in a column direction over a semiconductor substrate and which are constituted as respective sets of complementary data lines, each set of a complementary pair of data lines corresponding to an individual column of a SRAM, wherein each row thereof is correspondingly associated with a word line;
at least one memory cell which includes a pair of cross-coupled driver transistors and a pair of high-resistance load elements which are series coupled therewith, respectively, and first and second switching means, each of which is coupled between a respective one of said pair of driver transistors and a respective one of said data lines of a corresponding complementary data line pair, wherein each data line of said corresponding pair of complementary data lines extends in substantially the same direction as that of said high-resistance load elements and is formed above said semiconductor substrate and positioned so as to be substantially aligned over a corresponding one of the high-resistance load elements of said memory cell such that a projection of each data line of said complementary data line pair in the direction of said semiconductor substrate would fall on said corresponding high-resistance load element; and
a wiring for supplying a ground reference potential to said memory cell, said wiring being disposed as a wiring layer between the pair of high-resistance load elements of said memory cell and the corresponding pair of complementary data lines associated therewith and is formed so as to substantially cover the entire high-resistance load elements of said memory cell.

38. A semiconductor device according to claim 37, wherein said memory cell is a SRAM MISFET type memory cell of a SRAM array including a plurality of rows and columns of memory cells wherein each said pair of driver transistors and said first and second switching means thereof are MISFETs and wherein the switching MISFETs are controlled by a corresponding row word line.

39. A semiconductor device according to claim 38, wherein said wiring includes a plurality of same level wiring layers, each one corresponding to a ground reference potential wiring of all of the memory cells of a respective pair of adjacent rows of said SRAM array.

40. A semiconductor memory device comprising:
data lines which extend in a column direction over a semiconductor substrate and which are constituted as individual sets of complementary data lines, each set including a pair of complementary data lines and each data line of a corresponding pair of complementary data lines being coupled to an identical memory cell;
a plurality of memory cells each of which comprises cross-coupled first and second driver MISFETs and first and second switching MISFETs, each one of said first and second switching MISFETs being coupled between a respective one of said first and second driver MISFETs and a data line of a pair of complementary data lines associated therewith;
load elements which are respectively coupled to said first and second driver MISFETs of each memory cell, each of said data lines extending in substantially the same direction as that of said load elements and being formed above said semiconductor substrate and positioned so as to be substantially aligned over said load elements such that a projection of each data line in the direction of said semiconductor substrate would fall on a load element associated therewith, wherein each one of said load elements includes a high-resistance portion; and
wirings for supplying a ground potential to said plurality of memory cells, said wirings being disposed as a wiring layer between said load elements and said data lines, and each wiring associated with a memory cell for supplying a ground potential thereto is formed as to cover substantially the entire high resistance portion of the respective load elements to which the memory cell is coupled therewith.

41. A semiconductor memory device according to claim 40, wherein said load elements are comprised of polycrystalline silicon, said wiring layer is comprised of a first-level aluminum layer, and said data line is comprised of a second-level aluminum layer.

42. A semiconductor memory device according to claim 41, wherein said high-resistance portion is substantially a non-doped portion of said polycrystalline silicon.

43. A semiconductor memory device according to claim 40, wherein said semiconductor memory device further comprises:
first word lines which extend in said row direction over said semiconductor substrate; and
second word lines which extend in said row direction, wherein said second word lines are formed above said first word lines and are comprised of a layer which is the same level layer as said wiring layer.

44. A semiconductor memory device according to claim 43, wherein said second word lines and said wiring layer are comprised of a first-level aluminum layer, and said second word lines are electrically shorted to said first word lines.

45. A semiconductor memory device according to claim 44, wherein said first word lines are made of a double-layer film comprising a first film of polycrystalline silicon and a second film of a silicide formed as a compound of silicon and a refractory metal.

* * * * *

UNITED STATES PATENT AND TRADEMARK OFFICE
CERTIFICATE OF CORRECTION

PATENT NO. : 5,005,068
DATED : April 2, 1991
INVENTOR(S) : S. Ikeda et al

It is certified that error appears in the above-identified patent and that said Letters Patent is hereby corrected as shown below:

In column 12, line 18, "claim 3" should read

--claim 1--.

Signed and Sealed this

Ninth Day of March, 1993

Attest:

STEPHEN G. KUNIN

*Attesting Officer*   *Acting Commissioner of Patents and Trademarks*